(12) United States Patent
Nilssen

(10) Patent No.: US 6,211,619 B1
(45) Date of Patent: Apr. 3, 2001

(54) ELECTRONIC BALLAST CATHODE HEATING CIRCUIT

(76) Inventor: Ole K. Nilssen, 408 Caesar Dr., Barrington, IL (US) 60010

(*) Notice: Subject to any disclaimer, the term of this patent is extended or adjusted under 35 U.S.C. 154(b) by 1252 days.

(21) Appl. No.: 08/502,817

(22) Filed: Jul. 14, 1995

Related U.S. Application Data

(63) Continuation of application No. 08/394,251, filed on Feb. 24, 1995, now Pat. No. 6,172,464, which is a continuation-in-part of application No. 07/579,569, filed on Sep. 10, 1990, now abandoned, which is a continuation-in-part of application No. 06/787,692, filed on Oct. 15, 1985, now abandoned, which is a continuation of application No. 06/644,155, filed on Aug. 27, 1984, now abandoned, which is a continuation of application No. 06/555,426, filed on Nov. 23, 1983, now abandoned, which is a continuation of application No. 06/178,107, filed on Aug. 14, 1980, now abandoned.

(51) Int. Cl.$^7$ ................................. H05B 37/02
(52) U.S. Cl. .............. 315/106; 315/244; 315/225; 315/307; 315/DIG. 7
(58) Field of Search ................. 315/244, 100, 315/101, 105, 99, 106, 107, DIG. 7, 307, 219, 209 R, 225

(56) References Cited

U.S. PATENT DOCUMENTS

| | | | | |
|---|---|---|---|---|
| 2,333,499 | * | 11/1943 | Warren | 315/105 |
| 2,339,051 | * | 1/1944 | Cates et al. | 315/100 |
| 2,476,329 | * | 7/1949 | Sitzer | 315/100 |
| 3,691,450 | * | 9/1972 | Cox | 315/DIG. 7 |
| 4,370,600 | * | 1/1983 | Zansky | 315/243 |

* cited by examiner

Primary Examiner—Michael B. Shingleton

(57) ABSTRACT

In a high-frequency electronic ballast, a screw-in fluorescent lamp is connected with and powered by way of a series-resonant LC circuit. A resistive load is connected with the LC circuit, thereby to constitute a load therefor before ignition of the fluorescent lamp or in case the fluorescent lamp were to fail to ignite.

8 Claims, 3 Drawing Sheets

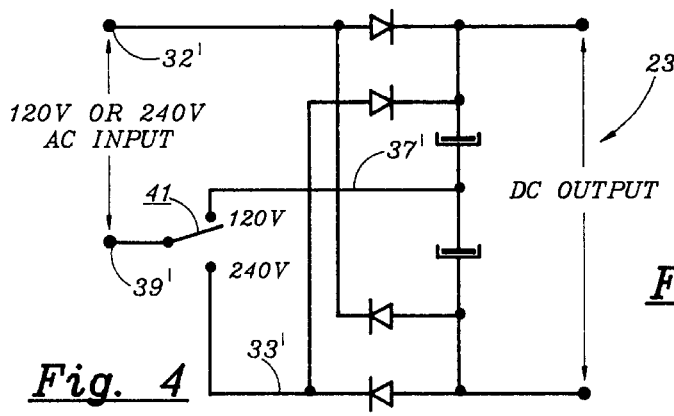
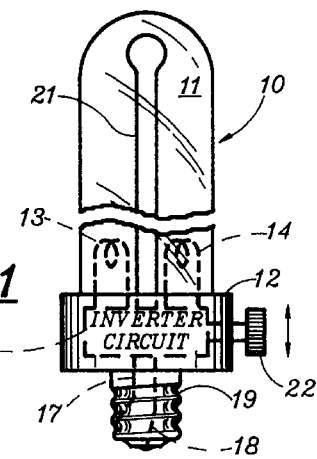
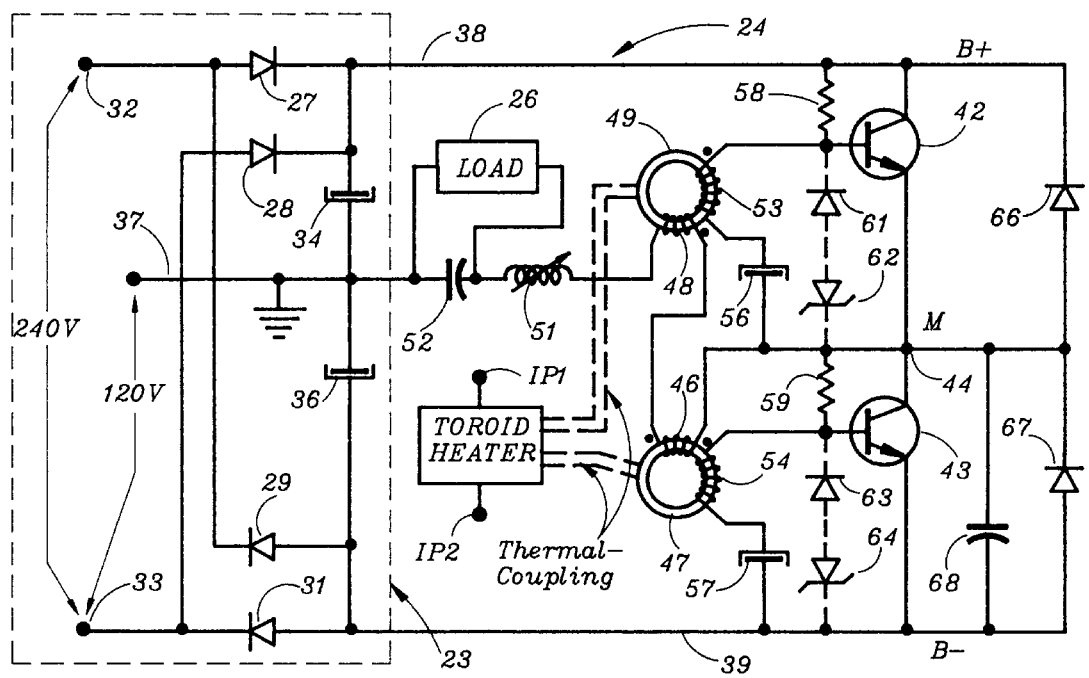
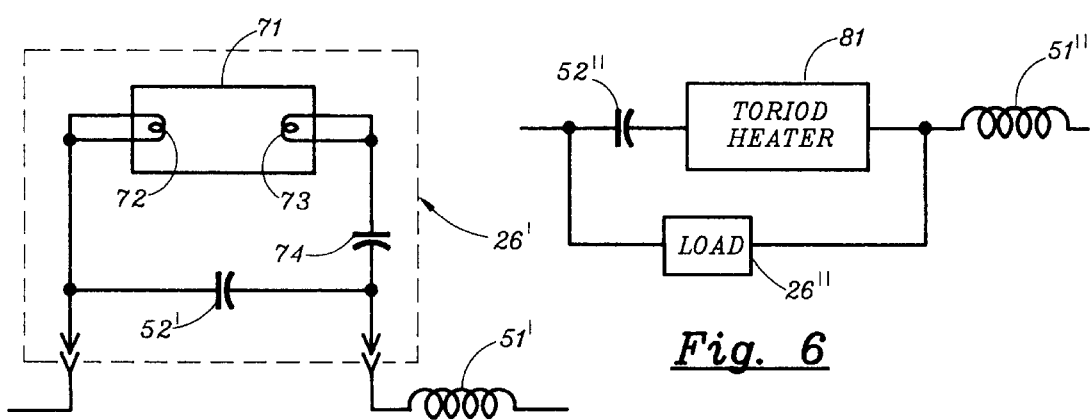

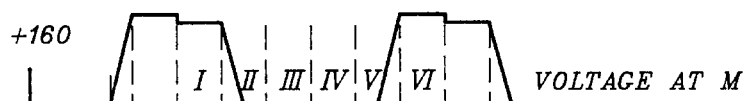
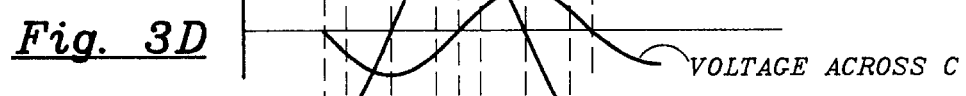
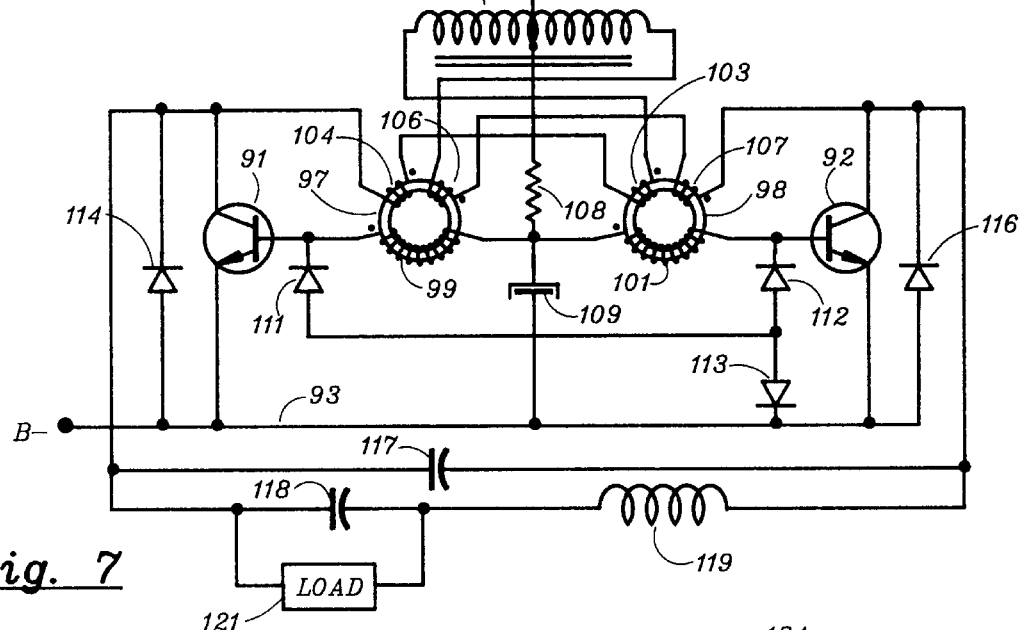
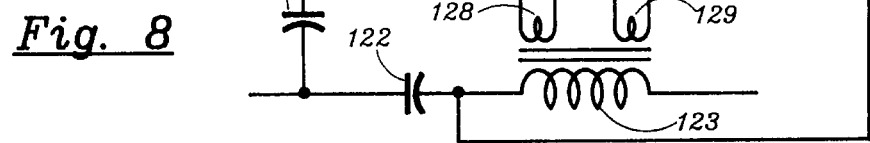

1

ELECTRONIC BALLAST CATHODE HEATING CIRCUIT

RELATED APPLICATIONS

The present application is a Continuation of Ser. No. 08/394,251 filed Feb. 24, 1995 now U.S. Pat. No. 6,172,464; which is a Continuation-in-Part of Ser. No. 07/579,569 filed Sep. 10, 1990, now abandoned; which is a Continuation-in-Part of Ser. No. 06/787,692 filed Oct. 15, 1985 now abandoned; which is a Continuation of Ser. No. 06/644,155 filed Aug. 27, 1984, now abandoned; which is a Continuation of Ser. No. 06/555,426 filed Nov. 23, 1983, now abandoned; which is a Continuation of Ser. No. 06/178,107 filed Aug. 14, 1980, now abandoned.

BACKGROUND OF INVENTION

1. Field of Invention

This invention relates to electronic ballasts for rapid-start fluorescent lamps, particularly where the lamps are powered via a series-resonant LC circuit.

2. Description of Prior Art

For a description of pertinent prior art, reference is made to U.S. Pat. No. 4,677,345 to Nilssen; which patent issued from a Division of application Ser. No. 06/178,107 filed Aug. 14, 1980; which application is the original progenitor of instant application.

Otherwise, reference is made to the following U.S. Pat. Nos. 3,263,122 to Genuit; U.S. Pat. No. 3,320,510 to Locklair; U.S. Pat. No. 3,996,493 to Davenport et el.; U.S. Pat. No. 4,100,476 to Ghiringhelli; U.S. Pat. No. 4,262,327 to Kovacik et al.; U.S. Pat. No. 4,370,600 to Zansky; U.S. Pat. No. 4,634,932 to Nilssen; and U.S. Pat. No. 4,857,806 to Nilssen.

SUMMARY OF THE INVENTION

Objects of the Invention

Objects of the present invention are those of providing for cost-effective electronic ballasts as well as compact screw-in fluorescent lamps.

This as well as other objects, features and advantages of the present invention will become apparent from the following description and claims.

Brief Description

The present invention is directed to providing improved inverter circuits for powering and controlling gas discharge lamps. The inverter circuits according to the present invention are highly efficient, can be compactly constructed and are ideally suited for energizing gas discharge lamps, particularly "instant-start" and "self-ballasted" fluorescent lamps.

According to one form of the present invention, a series-connected combination of an inductor and a capacitor is provided in circuit with the inverter transistors to be energized upon periodic transistor conduction. Transistor drive current is preferably provided through the use of at least one saturable inductor to control the transistor inversion frequency to be equal to or greater than the nature resonant frequency of the inductor and capacitor combination. The high voltages efficiently developed by loading the inverter with the inductor and capacitor are ideally suited for energizing external loads such as gas discharge lamps. In such an application, the use of an adjustable inductor permits control of the inverter output as a means of adjusting the level of lamp illumination.

According to another important form of the present invention, reliable and highly efficient half-bridge inverters include a saturable inductor in a current feedback circuit to drive the transistors for alternate conduction. The inverters also include a load having an inductance sufficient to effect periodic energy storage for self-sustained transistor inversion. Importantly, improved reliability is achieved because of the relatively low and transient-free voltages across the transistors in these half-bridge inverters.

Further, according to another feature of the present invention, novel and economical power supplies particularly useful with the disclosed inverter circuits convert conventional AC input voltages to DC for supplying to the inverters.

Yet further, according to still another feature of the invention, a rapid-start fluorescent lamp is powered by way of a series-resonant LC circuit; while heating power for the lamp's cathodes is provided via loosely-coupled auxiliary windings on the tank inductor of the LC circuit. Alternatively, cathode heating power is provided from tightly-coupled windings on the tank inductor; in which case output current-limiting is provided via a non-linear resistance means, such as an incandescent filament in a light bulb, connected in series with the output of each winding.

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIG. 3A–3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter output;

FIG. 7 is an alternate form of push-pull inverter circuit according to the present invention;

FIG. 8 is a schematic diagram showing the connection of a gas discharge lamp of the "rapid-start" type to an inductor-capacitor-loaded inverter according to the present invention;

DESCRIPTION OF THE PREFERRED EMBODIMENTS

Figure 9:
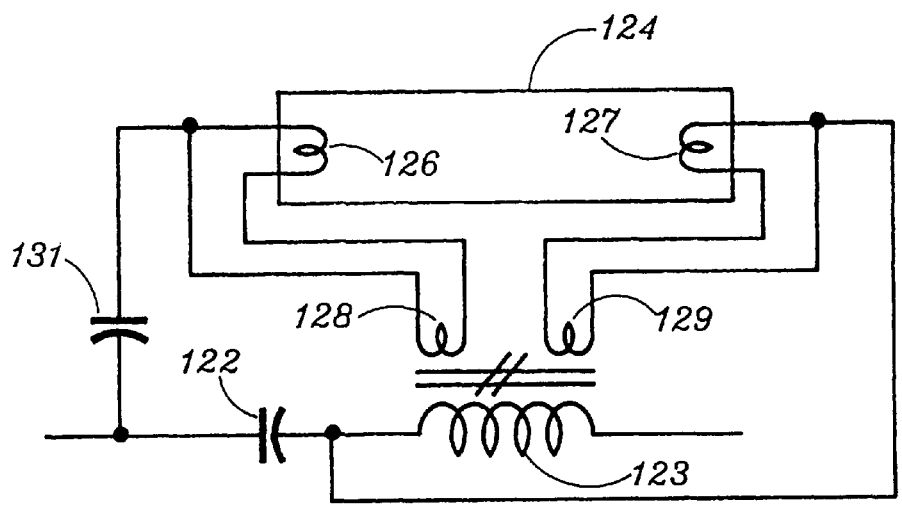
FIG. 9 is a modification of FIG. 8, showing loosely-coupled auxiliary windings on the tank inductor.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12.

The inverter circuit 16 is connected by leads 17, 18 to a screw-type plug 19 adapted for screw-in insertion into a standard Edison-type incandescent lamp socket at which ordinary 120 Volt/60 Hz power line voltage is available. A ground plane comprising a wire or metallic strip 21 is disposed adjacent a portion of the fluorescent lamp 11 as a starting aid. Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B– line 39, respectively. The power supply 23 also comprises a voltage doubler and rectifier optionally connectable to a 120 volt AC input taken between the ground line 37 and terminal 33 0r 32. The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and –160 volts on the B– line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B– lines 38 and 39, respectively. The collector of transistor 42 is connected to the B+ line 38, the emitter of transistor 42 and the collector of transistor 43 are connected to a midpoint line 44 (designated "M") and the emitter of transistor 43 is connected to the B– line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B– lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 64 in turn connected to the midpoint line 44; similarly, a diode 63 and series Zener diode 64 in turn connected to the B– line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 38 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become non-conductive. As shown in FIG. 3C, current-flow in transistor 43 terminates at the end of period I.

Because the current through inductor 51 cannot change instantaneously, current will flow from the B– bus 39 through capacitor 68, causing the voltage at midpoint line 44 to drop to –160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B– bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equal to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47,49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impdance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B− line 93. A B+ lead 94 is connected to the center-tap of a transformer 96. In order to provide drive current to the transistors 91, 92 for control of their conduction frequency, saturable inductors 97, 98 have secondary windings 99, 10, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B− lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B− lead 93. The common Zener diode 113 serves the same function as individual Zener diodes 62, 64 in FIG. 2.

Shunt diodes 114, 116 are connected across the collector-emitter terminals of transistors 91, 92, respectively. A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplication). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

FIG. 9 illustrates the very same circuit arrangement as that of FIG. 8 except that the auxiliary windings 128, 129 are only loosely coupled to the inductor 123, thereby providing for a manifest limitation on the amount of current that can be drawn from each auxiliary winding in case it were to be accidentally short-circuited.

Figure 10:
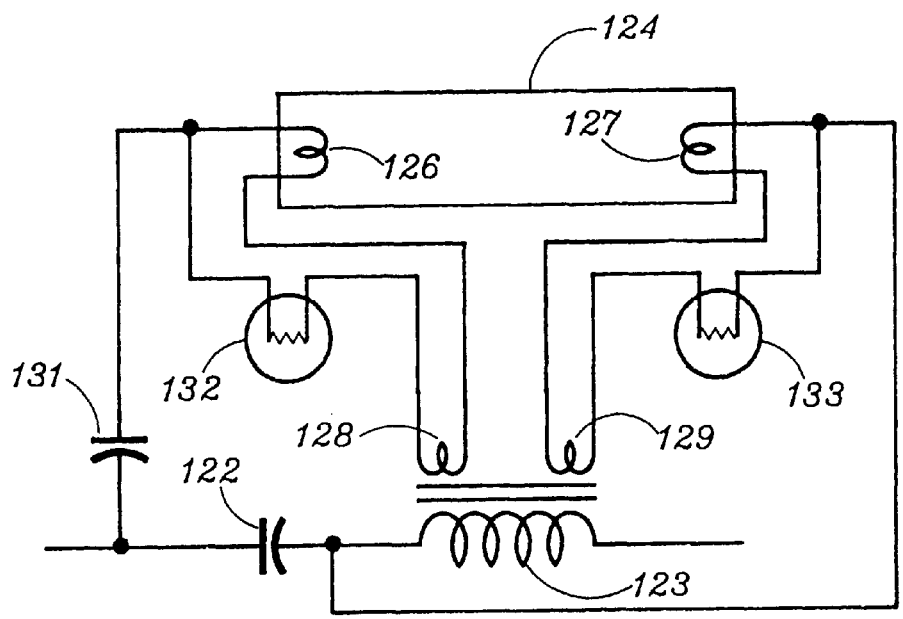
FIG. 10 is another modification of FIG. 8, showing non-linear current-limiting means connected with the output of tightly-coupled auxiliary windings on the tank inductor.

FIG. 10 also illustrates the very same circuit arrangement as that of FIG. 8 except that the cathodes 126, 127 are connected with their respective auxiliary windings 128, 129 by way of non-linear current-limiting means 132 and 133, respectively.

In FIG. 10, the non-linear current-limiting means 132, 133 are shown as being two (small) incandescent lamps. However, other types of non-linear resistance means could be used as well.

Both the FIG. 9 circuit and the FIG. 10 circuit serve the same basic purpose; which is that of preventing damage to the ballast circuit (such as that if FIG. 2) in case the leads used for connecting to one of the lamp cathodes 126, 127 were to be accidentally shorted. This damage prevention is accomplished by providing for manifest limitation of the maximum amount of current that can be drawn from each one of the auxiliary windings 128, 129. In the circuit of FIG. 9, this manifest limitation is accomplished by having the auxiliary windings 128, 129 couple sufficiently loosely to the main inductor 123—such as by providing a magnetic shunt between inductor 123 and the auxiliary windings—thereby correspondingly limiting the degree of impact resulting from an accidental short circuit. Such a short circuit would result in a net reduction in the effective inductance value of the tank inductor 123; which net reduction in inductance may, in turn cause a precipitous increase in the magnitude of the reactive current drawn from the inverter by the series-connected inductor 123 and capacitor 122, thereby causing damage to the inverter.

Additional Explanations and Comments (a) With reference to FIGS. 2 and 5, adjustment of the amount of power supplied to load 26', and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a few kHz, the load represented by a fluorescent lamp—once it is ignited—is substantially resistive. Thus, with the voltage across lamp 11 being of a substantially sinusoidal waveform (as indicated in FIG. 3D), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation—connection from a lamp's power supply and ballasting means need only be made with one of the terminals of each cathode.

(f) With respect to the circuit arrangement of FIG. 9, in situations where the tank inductor 123 includes a ferrite magnetic core having an air gap, one particularly cost-effective way of accomplishing the indicated loose coupling between the tank inductor 123 and the auxiliary windings 128, 129 is that of arranging for the auxiliary windings to be placed in the air gap in such a manner that they each couple only with part of the magnetic flux crossing the air gap.

(g) In FIG. 1, the compact screw-in fluorescent lamp has a longitudinal central axis penetrating through the center of the bottom of base 19 (i.e., at the point where lead 18 is connected), passing up centrally between the two legs of lamp 11, and emerging at the center of the very top of lamp 11.

What is claimed is:

1. An arrangement comprising:
   a source providing an alternating voltage across a pair of source terminals; the alternating voltage having a fundamental frequency distinctly higher than that of the AC voltage on an ordinary electric utility power line;
   a series-combination of an inductor and a capacitor; the series-combination being: (i) naturally resonant at a frequency lower than said fundamental frequency, (ii) effectively connected across the source terminals, thereby to draw a source current from the source terminals, and (iii) connected in circuit with a pair of output terminals across which is provided an approximately sinusoidal output voltage; the inductor being coupled with an auxiliary winding, thereby to cause an auxiliary voltage to be provided from this auxiliary winding; the coupling between the inductor and the auxiliary winding being sufficiently loose so that, in case an electrical short circuit were to be placed across the auxiliary winding, the magnitude of the source current would be prevented from increasing to a detrimentally high level; and
   a gas discharge lamp means having a first thermionic cathode with a pair of cathode terminals connected with the auxiliary winding by way of a connect means; the lamp means also having a second thermionic cathode; the approximately sinusoidal output voltage being applied between the first and the second thermionic cathodes.

2. An arrangement comprising:
   a source providing an alternating voltage across a pair of source terminals; the alternating voltage having a fundamental frequency distinctly higher than that of the AC voltage on an ordinary electric utility power line;
   a series-combination of an inductor and a capacitor; the series-combination being: (i) naturally resonant at a frequency lower than said fundamental frequency, (ii) effectively connected across the source terminals, thereby to draw a source current from the source terminals, and (iii) connected in circuit with a pair of output terminals across which is provided an approximately sinusoidal output voltage; the inductor means being coupled with an auxiliary winding, thereby to cause an auxiliary voltage to be provided from this auxiliary winding; the coupling between the inductor and the auxiliary winding being sufficiently loose so that, in case an electrical short circuit were to be placed across the auxiliary winding, the magnitude of the source current would be prevented from increasing to a detrimentally high level; and
   a gas discharge lamp having a first thermionic cathode with a pair of cathode terminals connected with the auxiliary winding by way of a connect means; the lamp also having a second thermionic cathode; the substantially sinusoidal output voltage being applied between the first and the second thermionic cathodes.

3. An arrangement comprising:
   a source providing an alternating voltage across a pair of source terminals; the alternating voltage having a fundamental frequency distinctly higher than that of the AC voltage on an ordinary electric utility power line;
   a series-combination of an inductor and a capacitor; the series-combination being: (i) naturally resonant at a frequency lower than said fundamental frequency, (ii) effectively connected across the source terminals, thereby to draw a source current from the source terminals, and (iii) connected in circuit with a pair of output terminals across which is provided an approximately sinusoidal output voltage; the inductor means being coupled with an auxiliary winding, thereby to cause an auxiliary voltage to be provided from this auxiliary winding; and
   a gas discharge lamp means having a first thermionic cathode with a pair of cathode terminals connected with the auxiliary winding by way of a connect means; the lamp means also having a second thermionic cathode; the substantially sinusoidal output voltage being applied between the first and the second thermionic cathodes; the connect means being characterized by including a resistor means.

4. The arrangement of claim 3 wherein the resistor means is a non-linear resistor means.

5. The arrangement of claim 3 wherein the resistor means includes an incandescent filament means.

6. An arrangement comprising:
   a source providing an alternating voltage across a pair of source terminals; the alternating voltage having a fundamental frequency distinctly higher than that of the AC voltage on an ordinary electric utility power line;
   a series-combination of an inductor and a capacitor; the series-combination being: (i) naturally resonant at a frequency lower than said fundamental frequency, (ii) effectively connected across the source terminals, thereby to draw a source current from the source terminals, and (iii) connected in circuit with a pair of output terminals across which is provided an approximately sinusoidal output voltage; the inductor means being coupled with an auxiliary winding, thereby to cause an auxiliary voltage to be provided from this auxiliary winding; and
   a gas discharge lamp means having a first thermionic cathode with a pair of cathode terminals connected with the auxiliary winding by way of a connect means; the lamp means also having a second thermionic cathode; the substantially sinusoidal output voltage being applied between the first and the second thermionic cathodes; the connect means including limiting means operative to manifestly limit to a pre-established level the magnitude of any current drawn from the auxiliary winding.

7. An arrangement comprising:
   a source providing an alternating voltage across a pair of source terminals; the alternating voltage having a fundamental frequency distinctly higher than that of the AC voltage on an ordinary electric utility power line;
   an inductive reactance combined with a capacitive reactance; the combination being: (i) naturally resonant at a frequency at or near said fundamental frequency, (ii) effectively connected across the source terminals, thereby to draw a source current from the source terminals, and (iii) connected in circuit with a pair of output terminals across which is provided an approximately sinusoidal output voltage; the inductive reactance being coupled with an auxiliary winding, thereby to cause an auxiliary voltage to be provided from this auxiliary winding; the auxiliary winding exhibiting a current-limiting feature by which, in case an electrical short circuit were to be placed across the auxiliary winding, the magnitude of any current thereby drawn therefrom would be manifestly limited to a level sufficiently low not to give rise to a damaging effect; and a gas discharge lamp having a first thermionic cathode with a pair of cathode terminals connected with the auxiliary winding; the lamp means also having a second thermionic cathode;

the approximately sinusoidal output voltage being applied between the first and the second thermionic cathodes.

8. An arrangement comprising:

a source providing an alternating voltage across a pair of source terminals; the alternating voltage having a fundamental frequency distinctly higher than that of the AC voltage on an ordinary electric utility power line;

an inductive reactance combined with a capacitive reactance; the combination being: (i) naturally resonant at a frequency at or near said fundamental frequency, (ii) effectively connected across the source terminals, thereby to draw a source current from the source terminals, and (iii) connected in circuit with a pair of output terminals across which is provided a high-frequency output voltage; the inductive reactance being coupled with an auxiliary winding, thereby to cause an auxiliary voltage to be provided from this auxiliary winding; the auxiliary winding exhibiting a current-limiting feature by which, in case an electrical short circuit were to be placed across the auxiliary winding, the magnitude of any current drawn therefrom would be prevented from increasing to a detrimentally high level; and a gas discharge lamp having a first thermionic cathode with a pair of cathode terminals connected with the auxiliary winding; the lamp means also having a second thermionic cathode; the high-frequency output voltage being applied between the first and the second thermionic cathodes.

* * * * *